(12) United States Patent
Kim

(10) Patent No.: US 7,173,878 B2
(45) Date of Patent: Feb. 6, 2007

(54) APPARATUS FOR DRIVING OUTPUT SIGNALS FROM DLL CIRCUIT

(75) Inventor: Kyoung Nam Kim, Gyeongsangbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 21 days.

(21) Appl. No.: 11/111,272

(22) Filed: Apr. 21, 2005

(65) Prior Publication Data

US 2006/0120206 A1    Jun. 8, 2006

(30) Foreign Application Priority Data

Dec. 3, 2004    (KR) ...................... 10-2004-0101264

(51) Int. Cl.
*G11C 8/00* (2006.01)
(52) U.S. Cl. .................. 365/233; 365/189.09; 365/194
(58) Field of Classification Search .......... 365/189.05, 365/194, 233; 326/30
See application file for complete search history.

(56) References Cited

U.S. PATENT DOCUMENTS 6,928,007 B2 *   8/2005   Jin ............................. 365/194
2004/0141391 A1 *   7/2004   Lee et al. ................... 365/200

FOREIGN PATENT DOCUMENTS

KR   10-2004 0095969   11/2004

* cited by examiner

*Primary Examiner*—Hoai V. Ho
(74) *Attorney, Agent, or Firm*—Ladas & Parry LLP

(57) ABSTRACT

Disclosed is an apparatus for driving output signals of a DLL circuit. The apparatus includes a first driving part and a second driving part for receiving output signals of the DLL circuit, wherein the DLL circuit is employed for a synchronous memory device, an output signal of the first driving part controls a data output driver of the synchronous memory device, and an output signal of the second driving part controls an ODT circuit of the synchronous memory device.

17 Claims, 4 Drawing Sheets

APPARATUS FOR DRIVING OUTPUT SIGNALS FROM DLL CIRCUIT

BACKGROUND OF THE INVENTION

1. Field of the Invention

The present invention relates to an apparatus for driving output signals from a DLL circuit, and more particularly to an apparatus for driving output signals from a DLL circuit, which has at least two driving parts for receiving the output signals from the DLL circuit.

2. Description of the Prior Art

As generally known in the art, a delay locked loop (DLL) circuit controls output timing of data read out from a synchronous memory device (hereinafter, referred to as "memory device") on the basis of a clock externally applied to the memory device.

FIG. 1 is a block diagram showing a structure of a typical DLL circuit 100 by way of example.

As shown in FIG. 1, the DLL circuit 100 includes clock buffers 11 and 12, a delay line 13, a divider 14, a dummy delay line 15, a replica model part 16, a phase comparator 17, and a delay control part 18.

In FIG. 1, the clock buffers 11 and 12 receive external clocks clk and clkb. Herein, an output signal rclk of the clock buffer 11 is synchronized with a rising edge of the external clock clk, and an output signal fclk of the clock buffer 11 is synchronized with a rising edge of the external clock clkb.

The delay line 13 delays the phases of the external clocks having passed through the clock buffer 11.

The divider 14 divides the frequency of the external clock having passed through the clock buffer 12 at the ratio of 1/n (generally, n is set to '4' or '8'). Herein, the division is mainly performed in order to reduce power consumption.

The dummy delay line 15 has the same structure as the delay line 13. Herein, since the dummy delay line 15 delays a signal divided by the divider 14, power consumption is lowered.

The replica model part 16 refers to a delay part obtained by modeling duration from application of the external clocks to arrival at the delay line 13 and duration until the output signals IRCLKDLL and IFCLKDLL of the delay line 13 are outputted to the outside of the memory device.

The phase comparator 17 detects a phase difference between the output signal of the divider 14 and the output signal of the replica model part 16. If rising edges of signals applied to the phase comparator 17 are coincident with each other, the DLL circuit is locked. At this time, the DLL clocks IRCLKDLL and IFCLKDLL lead about the length of 'tAC' over the external clocks.

The delay control part 18 controls the phases of signals applied to both the delay line 13 and the dummy delay line 15 in response to the output signal of the phase comparator 17.

FIG. 2 is a view showing an operation of the conventional apparatus for driving output signals from the DLL circuit, which employs the DLL circuit. The circuit shown in FIG. 2 has been employed for DDR2 SDRAM, DDR3 SDRAM, etc. having the ODT circuit. For reference, a signal Rasidle denotes a signal externally applied to the memory device. The signal Rasidle has a low level in an active mode and a high level in a precharge mode. A signal ODTEN denotes a signal outputted from the EMRS. The signal ODTEN enables an operation of the ODT.

As shown in FIG. 2, the output signal of the DLL circuit is simultaneously applied to both an ODT circuit 230 and an output driver 240 through a driving part 210.

Accordingly, conventionally, even when only the ODT circuit 230 is operated, the output driver 240 is enabled, thereby causing unnecessary power consumption.

SUMMARY OF THE INVENTION

Accordingly, the present invention has been made to solve the above-mentioned problem occurring in the prior art, and an object of the present invention is to provide a driving apparatus capable of driving an ODT circuit and an output driver, separately.

In order to accomplish this object, there is provided an apparatus for driving output signals of a DLL circuit, the apparatus including at least two driving parts for receiving the output signals of the DLL circuit, wherein output signals of each driving part are applied to a circuit part corresponding to the output signals.

An apparatus for driving output signals of a DLL circuit includes at least two driving parts.

According to another aspect of the present invention, there is provided an apparatus for driving output signals of a DLL circuit, the apparatus including a first driving part and a second driving part for receiving output signals of the DLL circuit, wherein the DLL circuit is employed for a synchronous memory device, an output signal of the first driving part controls a data output driver of the synchronous memory device, and an output signal of the second driving part controls an ODT circuit of the synchronous memory device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
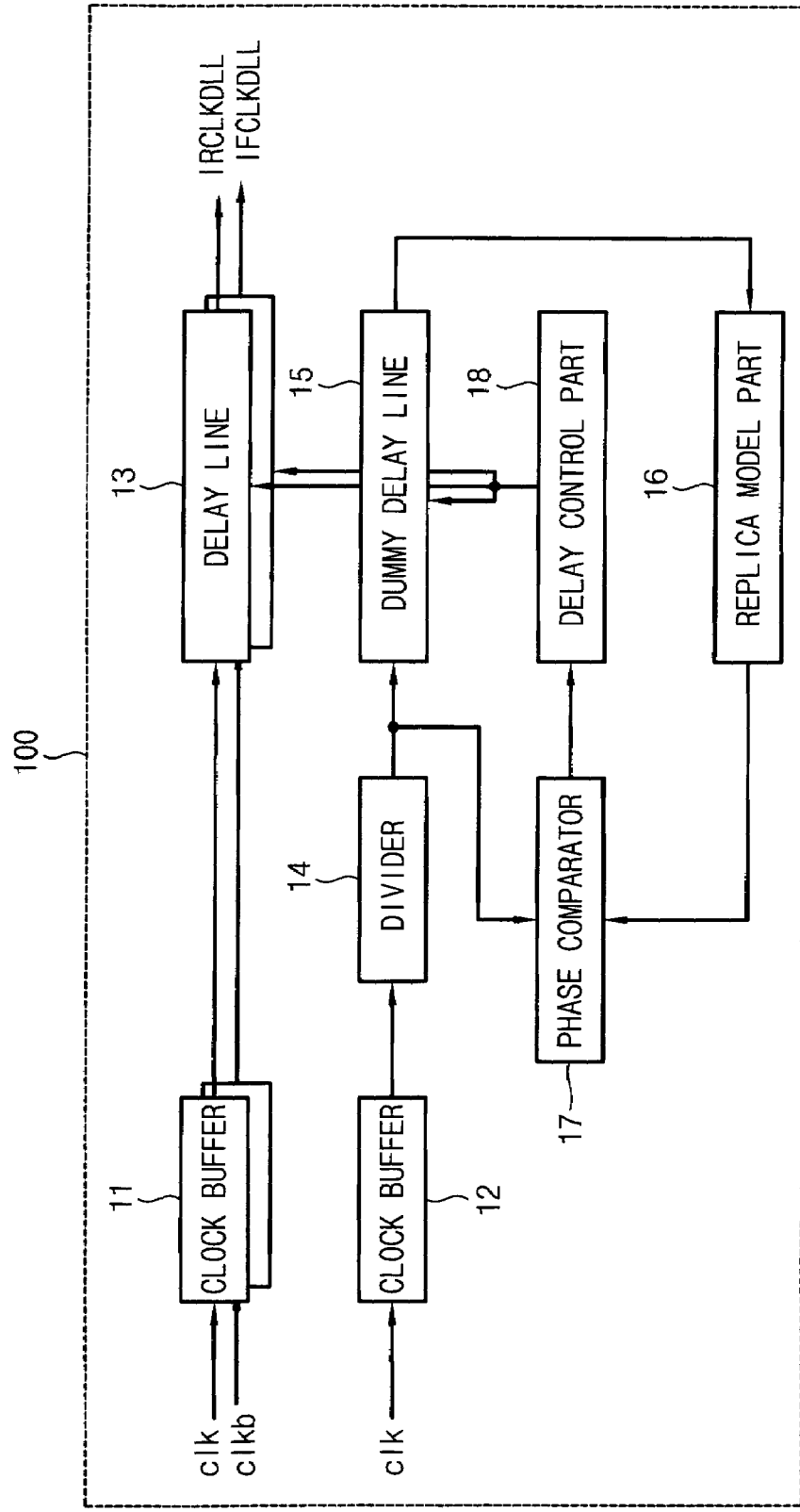
FIG. 1 is a block diagram showing an example of a typical DLL circuit.
Figure 2:
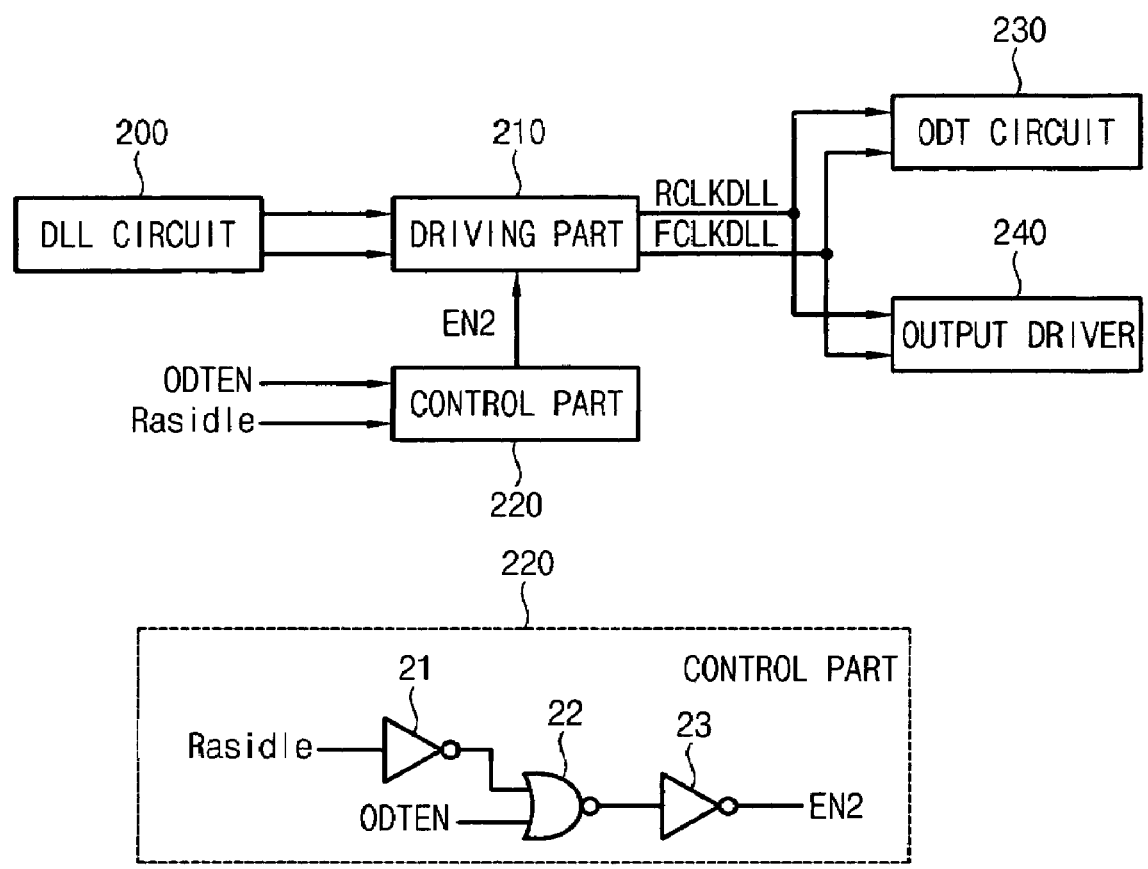
FIG. 2 is a view showing an operation of the conventional apparatus for driving output signals from a DLL circuit.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
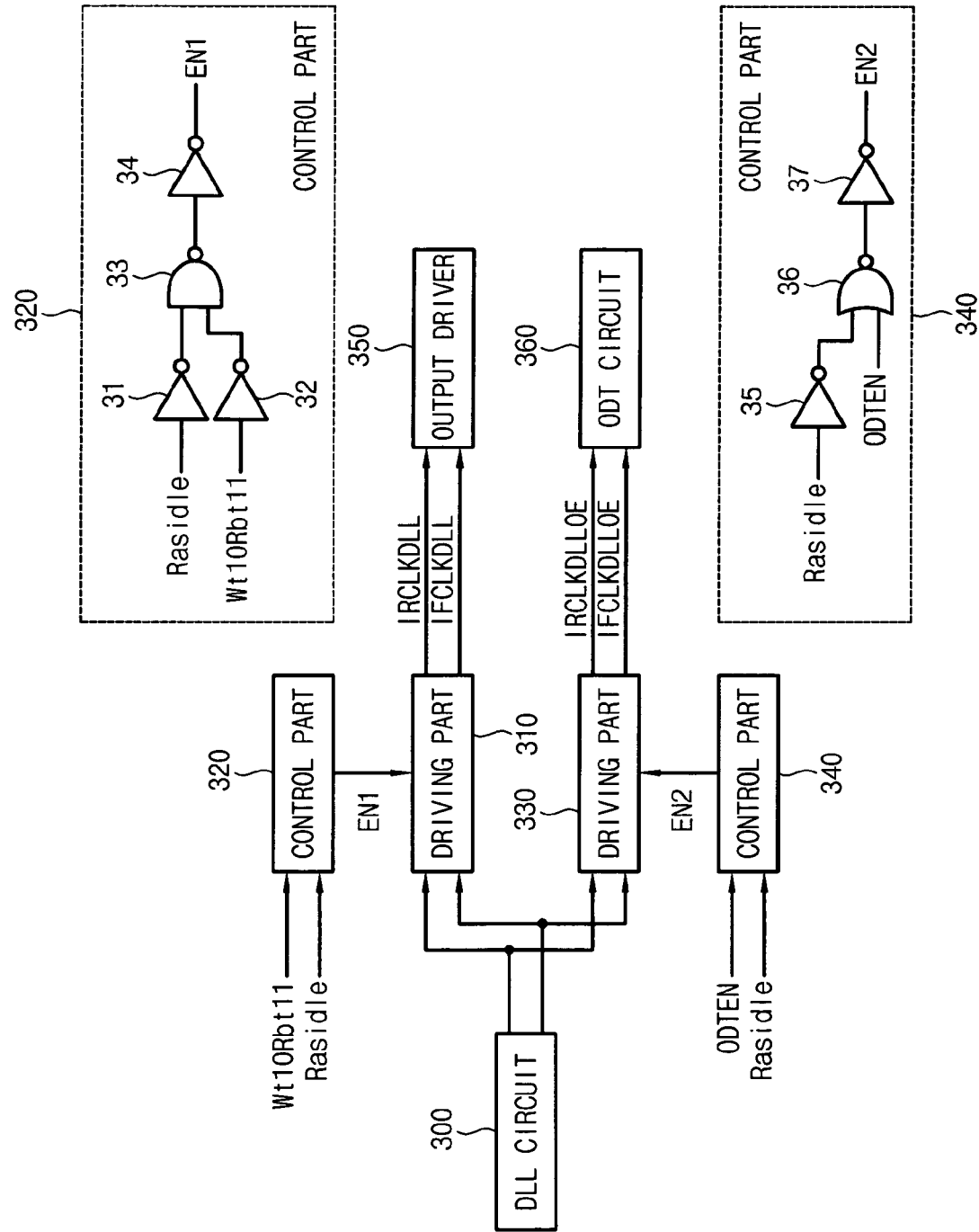
FIG. 3 is a block diagram showing an apparatus for driving output signals from a DLL circuit according to the present invention.

FIG. 3 is a block diagram showing an apparatus for driving output signals from a DLL circuit 300 according to the present invention.

As shown in FIG. 3, the apparatus includes driving parts 310 and 330 for receiving signals outputted from the DLL circuit 300.

The DLL circuit 300 of FIG. 3 represents all DLL circuits well known to those skilled in the art, in addition to the conventional DLL circuit disclosed through FIG. 1. Also, the driving part 310 and the driving part 330 shown in FIG. 3 include a pull-up driver and a pull-down driver well known to those skilled in the art. Herein, it is preferred that the driving part 310 has the same size as the driving part 330. However, the driving part 310 may have a different size depending on loading for the next end driven by the driving part.

As shown in FIG. 3, the operation of the driving part 310 is controlled by a control part 320 receiving signals Wt10Rbt11 and Rasidle, and the operation of the driving part 330 is controlled by a control part 340 receiving signals ODTEN and Rasidle.

The control part 320 includes an inverter 31 receiving the signal Rasidle, an inverter 32 receiving the signal Wt10Rbt11, a NAND gate 33 receiving output signals of both the inverter 32 and the inverter 31, and an inverter 34 receiving an output signal of the NAND gate 33. The control part 320 controls the operation of the driving part 310 by means of an output signal EN1 of the inverter 34.

The control part 340 includes an inverter 35 receiving the signal Rasidle, a NOR gate 36 receiving both an output signal of the inverter 35 and an ODT enable signal ODTEN, and an inverter signal 37 for receiving an output signal of the NOR gate 36. Herein, the operation of the driving part 330 is controlled by an output signal EN2 of the inverter 37. Herein, those skilled in the art can realize various circuits performing functions identical to those of the control parts 320 and 340.

Output signals IRCLKDLL and IFCLKDLL of the driving part 310 are applied to a data output driver 350 of a synchronous memory device so as to adjust a data output time point of the data output driver 350. In addition, output signals IRCLKDLLOE and IFCLKDLLOE of the driving part 330 are applied to an ODT circuit 360 of the synchronous memory device in such a manner that an impedance calibration operation may be performed. Since the driving parts 310 and 330 independently operate, the output driver 350 and the ODT circuit 360 (controlled by the output signals of the driving parts 310 and 330, respectively) independently operate also. Therefore, power consumption may be reduced as compared with the conventional apparatus for simultaneously driving an output driver and an ODT circuit.

Hereinafter, description about the operation according to one embodiment of the present invention disclosed through FIG. 3 will be given in detail.

First, the meanings of the signals shown in FIG. 3 will be described.

The signal Wt10Rbt11 represents a write mode or a read mode. The signal Wt10Rbt11 maintains a high level in a write mode and a low level in a read mode.

The signal Rasidle is externally applied to the memory device. The signal Rasidle maintains a low level in an active mode and a high level in a precharge mode.

The signal ODTEN is outputted from the EMRS and enables the ODT operation.

Hereinafter, the operations of the control part 320 and the driving part 310 will be described.

When the signal Rasidle (row address select idle) is in a low level (i.e., an active mode) and the signal Wt10Rbt11 is in a high level (i.e., a write mode), the output signal EN1 of the control part 320 is in a low level. Accordingly, the driving part 310 and the data output driver 350 are disabled. Therefore, in a write mode, it is possible to reduce current consumption in both the driving part 310 and the data output driver 350.

When the signal Rasidle is in a low level (i.e., an active mode) and the signal Wt10Rbt11 is in a low level (i.e., a read mode), the output signal EN1 of the control part 320 is in a high level. Accordingly, the driving part 310 and the output driver 350 are enabled.

When the signal Rasidle is in a high level (i.e., a precharge mode), the driving part 310 and the output driver 350 are always disabled. That is, in a precharge mode, it is possible to reduce current consumption in the driving part 310 and the output driver 350.

Hereinafter, the control part 340 and the driving part 330 will be described.

If the signal ODTEN (on-die termination enable) for performing an ODT (on-die termination) operation is outputted from the EMRS (extended mode register set), the ouput signal EN2 of the control part 340 is always in a high level regardless of the value of the signal Rasidle. Accordingly, the driving part 330 and the ODT circuit 360 are enabled.

When the signal ODTEN is in a low level, the output signal EN2 of the control part 340 is determined by the signal Rasidle. That is, if the signal Rasidle is in a high level (in a precharge mode), the driving part 330 and the ODT circuit 360 are disabled. If the signal Rasidle is in a low level (in an active mode), the driving part 330 and the ODT circuit 360 are enabled.

Figure 4:
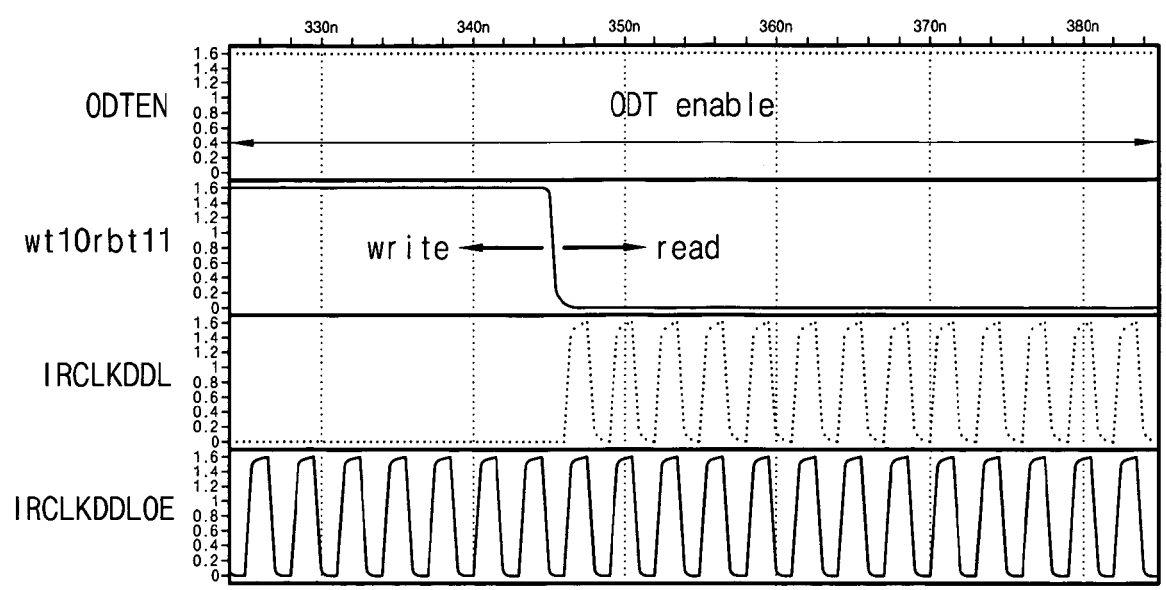
FIG. 4 is a time chart showing an operation of the apparatus shown in FIG. 3.

FIG. 4 is a time chart for explaining the operation according to the present invention.

As understood from FIG. 4, during the high level of the signal ODTEN, the driving part 330 delivers the signal received from the DLL circuit 330 to the ODT circuit 360.

Meanwhile, it can be understood that the driving part 310 is disabled in a write mode and is enabled in a read mode regardless of the signal ODTEN.

Although two driving parts are included in the apparatus shown in FIGS. 3 and 4, at least three driving parts may be included according to the spirit of the present invention.

In addition, the spirit of the present invention can be applied to all semiconductor devices using DLL circuits in addition to memory devices.

When the spirit of the present invention is employed, a driving part for receiving the output signal of the DLL circuit is independently operated, thereby reducing power consumption as compared with the conventional apparatus.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for driving output signals of a DLL (delay locked loop) circuit, the apparatus comprising:
   a first driving part and a second driving part for receiving output signals from the DLL circuit, wherein the DLL circuit is employed by a synchronous memory device, an output signal of the first driving part controls a data output driver of the synchronous memory device, and an output signal of the second driving part controls an ODT (on-die termination) circuit of the synchronous memory device.

2. An apparatus for driving output signals of a delay locked loop (DLL) circuit in which the DLL circuit is employed by a synchronous memory device, the apparatus comprising:
   a first driving part and a second driving part for receiving output signals of the delay locked loop DLL circuit, an output signal of the first driving part controls a data output driver of the synchronous memory device, and an output signal of the second driving part controls an on-die termination (ODT) circuit of the synchronous memory device, wherein the first driving part is disabled if the synchronous memory device is in a precharge mode or in a write mode, the first driving part is enabled if the synchronous memory device is in a read mode, the second driving part is enabled if the synchronous memory device is in an ODT operation mode, and the second driving part is disabled if the synchronous memory device is not in the ODT operation mode.

3. The apparatus as claimed in claim 2, wherein the first diving part and the second driving part independently operate from each other.

4. The apparatus as claimed in claim 2, wherein the second driving part is enabled in an active mode and disabled in a precharge mode.

5. An apparatus for driving output signals of a delay locked loop (DLL) circuit in which the DLL circuit is employed by a synchronous memory device, the apparatus comprising:
 a first driving part operatively configured to the DLL circuit to receive output signals from the DLL circuit;
 a first control part operatively configured to the first driving part to send output signals from the first control part to control the first driving part;
 a second driving part operatively configured to the DLL circuit to receive output signals from the DLL circuit; and
 a second control part operatively configured to the second driving part to send output signals from the second control part to control the second driving part, wherein the first and second driving parts operate independent from each other.

6. The apparatus of claim 5 further comprising:
 a data output driver operatively configured to the first driving part to receive output signals from the first driving part; and
 an on-die termination (ODT) circuit operatively configured to the second driving part to receive output signals from the second driving.

7. The apparatus of claim 6 wherein the first control part operatively configured to receive a row address select idle (Rasidle) signal and a write/read (Wt10Rbt11) signal.

8. The apparatus of claim 7 wherein when the Rasidle signal is in a state associated with a precharge mode then the first control part and the data output driver are operatively configured to be disabled.

9. The apparatus of claim 7 wherein when the Rasidle signal is in a state associated with an active mode and the Wt10Rbt11 signal is in a state associated with a write mode then the first control part and the data output driver are operatively configured to be disabled.

10. The apparatus of claim 7 wherein when the Rasidle signal is in a state associated with an active mode and the Wt10Rbt11 signal is in a state associated with a read mode then the first control part and the data output driver are operatively configured to be enabled.

11. The apparatus of claim 6 wherein the second control part operatively configured to receive a row address select idle (Rasidle) signal and an on-die termination enable (ODTEN) signal.

12. The apparatus of claim 11 wherein when the ODTEN signal is in a state associated with an enable mode then the second control part and the ODT circuit are operatively configured to be enabled.

13. The apparatus of claim 11 wherein when the ODTEN signal is in a state associated with an unenable mode and the Rasidle signal is in a stats associated with an precharge mode then the second control part and the ODT circuit are operatively configured to be disable.

14. The apparatus of claim 11 wherein when the ODTEN signal is in a state associated with an unenable mode and the Rasidle signal is in a state associated with an active mode then the second control part and the ODT circuit are operatively configured to be enabled.

15. The apparatus of claim 11 wherein the ODTEN signal is outputted from an extended mode register set (EMRS).

16. The apparatus of claim 6 wherein the first control part comprising
 a first inverter having an input and an output, wherein the input of the first inverter operatively connected to receive the Rasidle output signal;
 a second invader having an input and an output, wherein the input of the second inverter operatively connected to receive the Wt10Rbt11 signal;
a NAND gate having a first and second input and an output, wherein the first input of the NAND gate operatively connected to an output of the first inverter and the second input of the NAND gate operatively connected to an output of the second inverter;
 a third inverter having an in put and an output, wherein the input of the third inverter operatively connected to the output of the NAND gate and the output of the third inverter operatively connected to the first driving part.

17. The apparatus of claim 6 wherein the second control part comprising:
 a first inverter having an input and an output wherein the input of the first inverter operatively connected to receive the Rasidle output signal;
a NOR gate having a first and second input and an output, wherein the first input of the NOR gate operatively connected to the output of the first inverter, and the second input of the NOR gate operatively connected to receive the ODTEN signal; and
 a second inverter having an input and an output wherein the input of the second inverter operatively connected to the output of the NOR gate, and the output of the second inverter operatively connected to the second driving part.

* * * * *